US008354653B2

(12) United States Patent
Anella

(10) Patent No.: US 8,354,653 B2

(45) Date of Patent: Jan. 15, 2013

(54) TECHNIQUES FOR MANUFACTURING SOLAR CELLS

(75) Inventor: Steven M. Anella, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 490 days.

(21) Appl. No.: 12/555,917

(22) Filed: Sep. 9, 2009

(65) Prior Publication Data

US 2010/0059362 A1 Mar. 11, 2010

Related U.S. Application Data

(60) Provisional application No. 61/095,666, filed on Sep. 10, 2008.

(51) Int. Cl.
*G21K 5/00* (2006.01)
*H01J 37/08* (2006.01)

(52) U.S. Cl. ............ 250/492.21; 250/396 R; 250/492.2; 250/492.22; 250/492.3; 136/252; 136/258; 136/261

(58) Field of Classification Search .............. 250/396 R, 250/423 R, 424, 425, 491.1, 492.1, 492.2, 250/492.21, 492.22, 492.23, 492.3, 493.1; 136/243, 252, 256, 258, 261, 262
See application file for complete search history.

(56) References Cited

U.S. PATENT DOCUMENTS 4,086,102 A * 4/1978 King .............................. 136/256
4,140,610 A 2/1979 Morimoto
4,667,060 A * 5/1987 Spitzer .......................... 136/255
5,114,770 A * 5/1992 Echizen et al. ............... 427/575
5,270,227 A * 12/1993 Kameyama et al. .......... 438/234
6,184,111 B1 2/2001 Henley et al.
6,335,534 B1 * 1/2002 Suguro et al. ............ 250/492.21
6,498,348 B2 * 12/2002 Aitken ................... 250/396 ML
7,078,713 B2 * 7/2006 White ...................... 250/492.21
7,282,725 B2 * 10/2007 Shibata et al. ........... 250/492.21
8,035,087 B2 * 10/2011 White .................... 250/396 ML
8,101,998 B2 * 1/2012 Anil ............................. 257/347
8,269,284 B2 * 9/2012 Nil et al. ....................... 257/368
2006/0011582 A1 1/2006 Savas
2006/0258128 A1 * 11/2006 Nunan et al. .................. 438/510
2009/0068783 A1 3/2009 Borden
2009/0158236 A1 * 6/2009 Shibata ........................... 716/21
2009/0227062 A1 * 9/2009 Sullivan et al. ................. 438/61
2009/0261413 A1 * 10/2009 Anil ............................. 257/347
2010/0062589 A1 * 3/2010 Anella et al. .................. 438/527
2011/0193173 A1 * 8/2011 Nii et al. ....................... 257/368
2011/0320030 A1 * 12/2011 Riordon et al. ............... 700/121

FOREIGN PATENT DOCUMENTS

JP H06-124673 5/1994
JP H09-259779 10/1997
JP 2007-220707 8/2007

* cited by examiner

*Primary Examiner* — Bernard E Souw

(57) ABSTRACT

Techniques for manufacturing solar cells are disclosed. In one particular exemplary embodiment, the technique may be comprise disposing the solar cell downstream of an ion source; disposing a mask between the ion source and the solar cell, the mask including a front surface, a back surface, and at least one aperture extending in an aperture direction from the front surface to the back surface; and directing ions from the ion source to the solar cell along an ion beam path and through the at least one aperture of the mask, where the ion beam path may be non-parallel relative to the aperture direction.

18 Claims, 6 Drawing Sheets

TECHNIQUES FOR MANUFACTURING SOLAR CELLS

PRIORITY

This application claims priority to U.S. Provisional Patent Application Ser. No. 61/095,666, filed on Sep. 10, 2008, entitled "Method for Adjusting the Width of a Mask Aperture." The entire specification of U.S. Patent Application Ser. No. 61/095,666 is incorporated herein by reference.

FIELD

This application is related to manufacturing solar cells, more particularly to introducing particles to a substrate through a mask with small aperture.

BACKGROUND

Ion implantation is a standard technique for introducing conductivity-altering impurities into semiconductor substrates. A desired impurity material is ionized in an ion source, the ions are accelerated to form an ion beam of prescribed energy, and the ion beam is directed at the surface of the substrate. The energetic ions in the beam penetrate into the bulk of the semiconductor material and are embedded into the crystalline lattice of the semiconductor material to form a region of desired conductivity.

Solar cells are only one example of a device that uses silicon substrates, but these solar cells are becoming more important globally. Any reduced cost to the manufacturing or production of high-performance solar cells or any efficiency improvement to high-performance solar cells would have a positive impact on the implementation of solar cells worldwide. This will enable the wider availability of this clean energy technology.

In the conventional method for manufacturing the solar cells, the solar cells have been doped using a dopant-containing glass or a paste that is heated to diffuse dopants into the solar cell. This does not allow precise doping of the various regions of the solar cell and, if voids, air bubbles, or contaminants are present, non-uniform doping may occur. Solar cells could benefit from ion implantation because ion implantation allows precise doping of the solar cell. Ion implantation of solar cells, however, may require a certain pattern of dopants or that only certain regions of the solar cell substrate are implanted with ions. Previously, implantation of only certain regions of a substrate has been accomplished using photo-resist and ion implantation. Use of photo-resist, however, would add an extra cost to solar cell production because extra process steps are involved. This also poses a difficulty if the regions to be implanted are extremely small. Accordingly, there is a need in the art for improved doping of solar cells and, more particularly, a method of changing the width of an aperture in a mask used for doping solar cells.

SUMMARY

Techniques for manufacturing solar cells are disclosed. In one particular exemplary embodiment, the technique may be comprise disposing the solar cell downstream of an ion source; disposing a mask between the ion source and the solar cell, the mask including a front surface, a back surface, and at least one aperture extending in an aperture direction from the front surface to the back surface; and directing ions from the ion source to the solar cell along an ion beam path and through the at least one aperture of the mask, where the ion beam path may be non-parallel relative to the aperture direction.

In accordance to another embodiment of this particular exemplary embodiment, the aperture direction may be non-perpendicular relative to the solar cell.

Yet in accordance to another embodiment of this particular exemplary embodiment, the aperture direction may be substantially perpendicular relative to the solar cell.

In accordance to further embodiment of this particular exemplary embodiment, the technique may further comprise disposing the mask in a substantially parallel orientation with respect to the solar cell.

In accordance with additional embodiment of this particular exemplary embodiment, the technique may further comprise disposing the mask in a non-parallel orientation with respect to the solar cell.

In accordance with yet additional embodiment of this particular exemplary embodiment, the ion beam path may be substantially perpendicular to the solar cell.

In accordance with still another embodiment of this particular exemplary embodiment, the ions may contain one or more elements selected from a group consisting of hydrogen (H), boron (B), aluminum (Al), gallium (Ga), indium (In), thallium (Tl), carbon (C), silicon (Si), germanium (Ge), tin (Sn), lead (Pb), nitrogen (N), phosphorous (P), arsenic (As), antimony (Sb), bismuth (Bi) oxygen, tellurium (Te), fluorine (F), chlorine (Cl), helium (He), neon (Ne), krypton (Kr), argon (Ar), and xenon (Xe).

In accordance with another embodiment of this particular exemplary embodiment, the mask may comprise one or more materials selected from a group consisting of graphite, silicon, quartz, and SiC.

Yet in accordance with another embodiment of this particular exemplary embodiment, the aperture may have one or more shapes selected from a group consisting of a circular shape, a rectangular shape, an oval shape, and a square shape.

Still in accordance to another embodiment of this particular exemplary embodiment, the technique may further comprise contacting at least a portion of the mask to at least a portion of the solar cell.

In accordance to additional particular exemplary embodiment, the technique may be realized with an ion implanter. The ion implanter in this particular exemplary embodiment may comprise an ion source for generating ions; a target support disposed downstream of the ion source for supporting the solar cell in a target plane; a mask disposed between the ion source and the target support, the mask including a front surface, a back surface, and at least one aperture extending from the front surface to the back surface and along an aperture direction; and a beam-line component for directing ions to the solar cell along an ion beam path, wherein the ion beam path is non-parallel relative to the aperture direction.

In accordance to another embodiment of this particular exemplary embodiment, the aperture direction may be non-perpendicular relative to the solar cell.

In accordance to additional embodiment of this particular exemplary embodiment, the aperture direction may be substantially perpendicular relative to the solar cell.

In accordance to another embodiment of this particular exemplary embodiment, the mask may be in a substantially parallel orientation relative to the solar cell.

Yet in accordance to another particular embodiment of this particular exemplary embodiment, the mask may be in a non-parallel orientation with respect to the solar cell.

In accordance to yet additional embodiment of this particular exemplary embodiment, the ion beam path may be non-perpendicular relative to the solar cell.

Still yet in accordance to another embodiment of this particular exemplary embodiment, the at least one aperture may extend in a direction that is non-perpendicular to at least one of the front and back surface of the mask.

In accordance to another embodiment of this particular exemplary embodiment, the at least one aperture may extend in a direction that is substantially perpendicular to the at least one of the front and back surface of the mask.

Still in accordance to another embodiment of this particular exemplary embodiment, the ion may contain one or more elements selected from a group consisting of hydrogen (H), boron (B), aluminum (Al), gallium (Ga), indium (In), thallium (Tl), carbon (C), silicon (Si), germanium (Ge), tin (Sn), lead (Pb), nitrogen (N), phosphorous (P), arsenic (As), antimony (Sb), bismuth (Bi) oxygen, tellurium (Te), fluorine (F), chlorine (Cl), helium (He), neon (Ne), krypton (Kr), argon (Ar), and xenon (Xe).

In accordance to additional embodiment of this particular exemplary embodiment, the mask may comprise one or more materials selected from a group consisting of graphite, silicon, quartz, and SiC.

In accordance to yet another embodiment of this particular exemplary embodiment, the aperture may have one or more shapes selected from a group consisting of a circular shape, a rectangular shape, an oval shape, and a square shape.

In accordance to another embodiment of this particular exemplary embodiment, the ion implanter may further comprise a mask holder configured to support the mask in a mask plane, the mask plane being non-parallel to the target plane.

Yet in another particular exemplary embodiment, the technique may be realized with a mask for processing a substrate. The mask may comprise a front surface; a back surface; a first and second aperture side extending from the front surface to the back surface to define an aperture extending along an aperture direction, where at least a portion of the first aperture side surface may be non-perpendicular to at least one of the front and back surfaces.

In accordance to another embodiment of this particular exemplary embodiment, the aperture may have has one or more shapes selected from a group consisting of a circular shape, a rectangular shape, an oval shape, and a square shape.

Still in accordance to another embodiment of this particular exemplary embodiment, the mask may comprise one or more materials selected from a group consisting of graphite, silicon, quartz, and SiC.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings. These figures may not necessarily be drawn to scale. In addition, these figures should not be construed as limiting the present disclosure, but are intended to be exemplary only.

DETAILED DESCRIPTION

To solve the problems associated with the conventional method for manufacturing the solar cells, several embodiments of a new technique for manufacturing solar cells are introduced. For purpose of clarity and simplicity, the present disclosure focuses on the technique achieved with a beam-line ion implanter. However, those of ordinary skill in the art will recognize that the present disclosure is not limited therein. For example, other types of substrate processing systems including plasma assisted doping (PLAD) or plasma immersion ion implantation (PIII) systems may also be used.

The present disclosure also focuses on processing a substrate. For purpose of clarity and simplicity, the present disclosure focuses on processing solar cell substrates. The substrate may be a single crystalline, polycrystalline, microcrystalline, or amorphous substrate, or a micro-porous substrate. In addition, the substrate may contain a single material, or the substrate may be a compound, alloy, or mixture based substrate containing multiple materials. While silicon based solar cell substrate is mainly discussed, the present disclosure may be equally applicable to solar cell substrates containing other materials. For example, solar cell substrates containing cadmium telluride (CdTe), copper indium gallium selenide (CIGS), or other materials may also be applicable. In addition, those of ordinary skill in the art will recognize that other types of substrate may be used. Metallic, other types of semiconducting, or insulating substrates for manufacturing other electronic, optical, or other devices may be equally applicable to the present disclosure.

Figure 1:
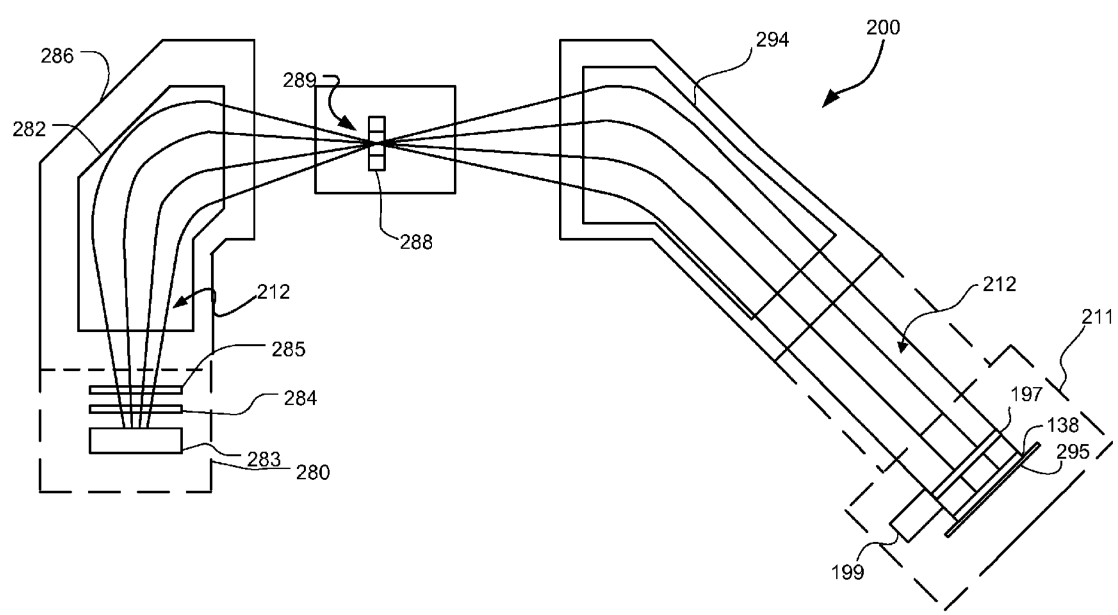
FIG. 1 illustrates a block diagram of an exemplary beam-line ion implanter that may be used to manufacture solar cells according to one embodiment of the present disclosure.

Referring to FIG. 1, there in shown an exemplary system for manufacturing solar cells according to one embodiment of the present disclosure. The figure illustrates a beam-line ion implanter 200. Those of ordinary skill in the art will recognize that the beam-line ion implanter 200 illustrated in the figure is only one of many examples of beam-line ion implanters applicable to the present disclosure. There may be other types of beam-line ion implanter that may equally be applicable. Other types of processing tool may also be equally applicable to the present disclosure.

As illustrated in FIG. 1, the beam-line ion implanter 200 may include an ion source 280 for generating ions of desired species. The ion source 280 may include an arc chamber 283 coupled to a gas box containing feed gas of desired species. The feed gas is supplied to the arc chamber 283 and, thereafter, ionized. This gas may contain species with one or more elements from Group I and 3A-8A. For example, the feed gas may contain hydrogen (H), helium (He) or other rare gases, oxygen (O), nitrogen (N), arsenic (As), boron (B), phosphorus (P), antimony, gallium (Ga), indium (In), or other gases. In addition, the feed gas may contain carborane $C_2B_{10}H_{12}$ or another large molecular compound. The ions generated in the arc chamber 283 are then extracted by an extraction electrode including a suppression electrode 284 and a ground electrode 285. A power supply may be connected to the extraction electrode and may provide an adjustable voltage. In the present disclosure, the ions 212 extracted from the arc chamber 283 may be atomic or molecular ions containing any element from Group I and 3A-8A. In one embodiment, the ions 212 may be boron ions. In another embodiment, the ions 212 may be carborane ions, boron difluoride ions, or other large molecular ions.

The ion implanter 200 may also comprise optional beam-line component which may select ions of desired species and manipulate into an ion beam. The optional beam-line components may include a mass analyzer 286 and an angle corrector magnet 294. The mass analyzer 386 may include a resolving magnet 282 and a masking electrode 288. If included, the ions 212 extracted from the arc chamber 283 are directed toward the mass analyzer 286 where they may be mass analyzed. For example, the resolving magnet 282 may deflect portions of the ions 212 based on their mass such that ions 212 having desired mass may pass through the resolving magnet 282 and/or the resolving aperture 289. The ions having undesired mass, meanwhile, may be blocked by the resolving magnet 282 and/or the masking electrode 288.

The ions 212 that pass through the resolving aperture 289 may be directed toward the angle corrector magnet 294. The angle corrector magnet 294 may convert the ions 281 from a diverging ion beam to a ribbon ion beam 212, which has substantially parallel ion trajectories or which has an ion beam path. For purpose of clarity and simplicity, the present disclosure may focus on a ribbon beam ion implanter. However, those of ordinary skill in the art will recognize that the present disclosure also encompasses ion implanter that uses a spot beam. The ion beam 212 passing through the angle corrector magnet 294 is then directed toward an end station 211 of the ion implanter 200. In some embodiments, the ions beam 212 may be accelerated or decelerated after passing through the angle corrector magnet 294 by an optional acceleration or deceleration units of the ion implanter 200.

In the end station 211, one or more substrates 138 may be positioned in the ion beam path such that the ions 212 may be introduced or, in some cases, implanted into the substrate 138. To control the implantation process, the end station 211 may contain various components. For example, the end station 211 may contain a platen 295 which may support the substrate 138. The platen 295 may also control, for example, the temperature of the substrate 138 to incorporate hot or cold ion implantation. To incorporate cold ion implantation, the substrate 138 may be maintained at a temperature less than the room temperature, preferably less than 273° K. To incorporate hot ion implantation, the substrate 138 may be maintained at a temperature above the room temperature, preferably greater than 293° K. In addition to the platen 295, the ion implanter 200 of the present disclosure may contain pre-chilling and/or pre-heating station (not shown) where the substrate 138 may be pre-chilled or pre-heated prior to ion implantation.

The end station 211 may also contain a substrate scanner (not shown), for example, a roplat, which may position the substrate 138 in the path of the ion beam 212. In addition to positioning the substrate 138, the substrate scanner may translate/rotate the substrate 138 to a desired orientation with respect to the ion beam. In one embodiment, the substrate 138 may be oriented at substantially perpendicular to the ion beam 212. In such an orientation, the ions may be introduced to the substrate 138 at substantially 0° angle. In another embodiment, the substrate may be oriented at an angle that is not perpendicular to the ions. In that embodiment, the ions may be introduced at an angle other than 0° angle. Yet in another example, the substrate 138 may be positioned at a first angle. During implantation, the substrate 138 may be rotated (or tilt) to an angle other than the first angle. In the present disclosure, the substrate 138 may also be translated, at a desired rate, so as to control the dose of the implanted ions.

The end station 211 may also include an automated substrate handling equipment for introducing/removing the substrate 138 to/from the end station 211. The end station 211 also may include a dose measuring system and an electron flood gun. It will be understood to those skilled in the art that the ion beam path may be evacuated.

In some embodiments, the end station 211 may also comprise a mask 197 proximate to the substrate 138. The mask 197 may comprise at least one aperture to introduce ions to selected one or more regions of the substrate 138. The mask 197 may be supported by the platen 295 and/or the substrate scanner. In another embodiment, the mask 197 may be supported by a mask holder 199 disposed on the platen 295 and/or the substrate scanner. Yet in another embodiment, the mask 197 may be supported by a mask holder 199 that is separate and independent from the platen 295 and/or the substrate scanner. The separate and independent mask holder 199 may be able to orient the mask 197 at different orientations relative to the ion beam 212 and/or the substrate 138. An actuator (not shown) may be coupled to the mask holder 199 to rotate or tilt the mask 300.

Figure 2A:
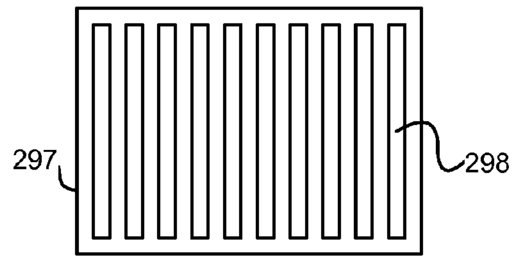
FIG. 2*a-f* illustrate several exemplary masks that may be used to manufacture solar cells according to the present disclosure.
Figure 2B:
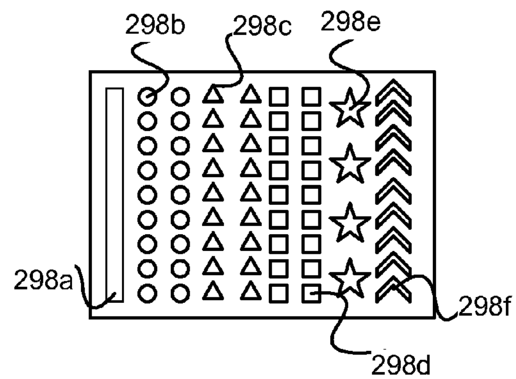

Referring to FIGS. 2*a* and 2*b*, there are shown plan views of several exemplary masks 297 for manufacturing solar cells according to one embodiment of the present disclosure. In the present disclosure, the mask 297 may be fabricated from graphite, silicon, quartz, SiC or other materials capable of withstanding the conditions associated with the ion implantation or vacuum environment. As illustrated in the figure, the mask 297 may comprise one or more apertures 298 through which ions 212 may pass and reach one or more selected regions of the substrate 138. In one embodiment, the apertures 298 may have a rectangular geometry (e.g. FIG. 2*a*). In other embodiments, the aperture 298 may have other types of geometry. Example of the aperture geometry may include a circular geometry 298*b*, an oval geometry (not shown), a triangular geometry 298*c*, a square geometry 298*d*, a star geometry 298*e*, and a chevron geometry 298*f*. Those of ordinary skill in the art will recognize that the mask 297 may comprise aperture of additional types of geometry and various sizes. If the mask 297 comprise a plurality of apertures 298, the shape and/or size of the apertures 298 may be the same or different. In addition, the location of each aperture 298 is not limited to a particular location.

Referring to FIG. 2*c*-2*f*, there are shown cross sectional views of the exemplary masks 297 shown in FIGS. 2*a* and 2*b*. In one embodiment of the present disclosure 298, the mask 297 may comprise a front surface 297*o* exposed to the ion beam 212 and a back surface 297*p* facing the substrate 138. The mask 297 may also comprise a first aperture side wall 297*a* positioned at one end of the aperture 298 and a second aperture side wall 297*b* positioned at opposite end of the aperture 298. The mask 297 may include additional aperture side walls (not shown) which, along with the first and second aperture side walls 297*a* and 297*b*, may define the aperture 298.

Figure 2C:
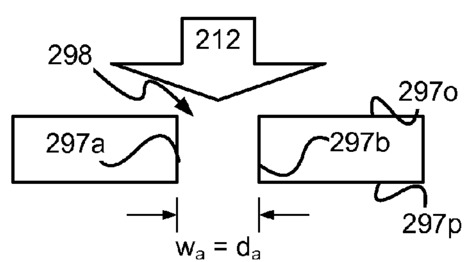
Figure 2D:
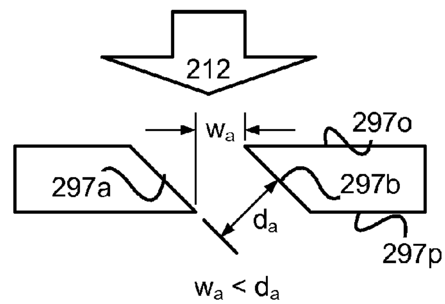
Figure 2E:
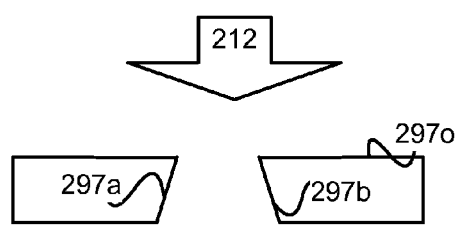
Figure 2F:
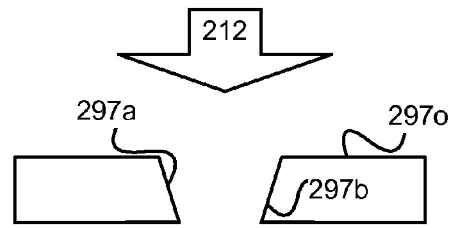

In this present embodiment, the first and second aperture side walls 297*a* and 297*b* may extend in a direction substantially perpendicular to the front and back surfaces 297*o* and 297*p* (FIG. 2*c*). In addition, both side walls 297*a* and 297*b* may be parallel to one another. Accordingly, the aperture 298 defined by the side walls 297$a$ and 297$b$ may be substantially perpendicular to the front and back surfaces 297$o$ and 297$p$ and the mask 297. The first and second side walls 297$a$ and 297$b$ may be spaced apart from one another (the aperture side wall distance) by $d_a$. If ions 212 are directed toward the mask 297 in a direction substantially parallel to the aperture 298, the aperture width $w_a$ through which the ions 212 may pass may be equal to the aperture side wall distance $d_a$.

In other embodiments, the aperture width $w_a$ may be different from the aperture side wall distance $d_a$. Referring to FIG. 2$d$, the mask 297 in another embodiment may comprise first and second aperture side walls 297$a$ and 297$b$ that extend in an approximately non-perpendicular direction relative to the front surface 297$o$, the back surfaces 297$p$ and/or the mask 297. Accordingly, the aperture 298 in this embodiment may also extend in a non-perpendicular direction relative to the front surface 297$o$, the back surfaces 297$p$, and the mask 297. If ions 212 are directed toward the mask 297 in a direction substantially non-parallel to the aperture 298, an additional shadowing effect may be caused by at least one of the first and second side walls 297$a$ and 297$b$, and additional ions may be blocked by the mask 297. As such, the aperture width $w_a$, through which the ions 212 may pass, may be smaller than the aperture side wall distance $d_a$.

In other embodiments of the present disclosure, at least one of the first and second aperture side walls 297$a$ and 297$b$ may extend in a non-perpendicular direction relative to the front surface 297$o$ or the back surface 297$p$. In addition, the side walls 297$a$ and 297$b$ may be in non-parallel relationship with one another. As illustrated in FIG. 2$e$, the first and second aperture side walls 297$o$ and 297$p$ of the mask 297, for example, may extend in diverging direction (from the front surface 297$a$ to the back surface 297$b$), as illustrated in FIG. 2$e$. In another example, the first aperture side wall 297$o$ and the second aperture side wall 297$p$ may extend in converging direction (from the front surface 297$a$ to the back surface 297$b$), as illustrated in FIG. 2$f$. If ions 212 are directed toward the mask 297 in a direction substantially perpendicular to the mask 297, the aperture width $w_a$ through which the ions 212 may pass may be smaller than the aperture side wall distance $d_a$.

Figure 3:
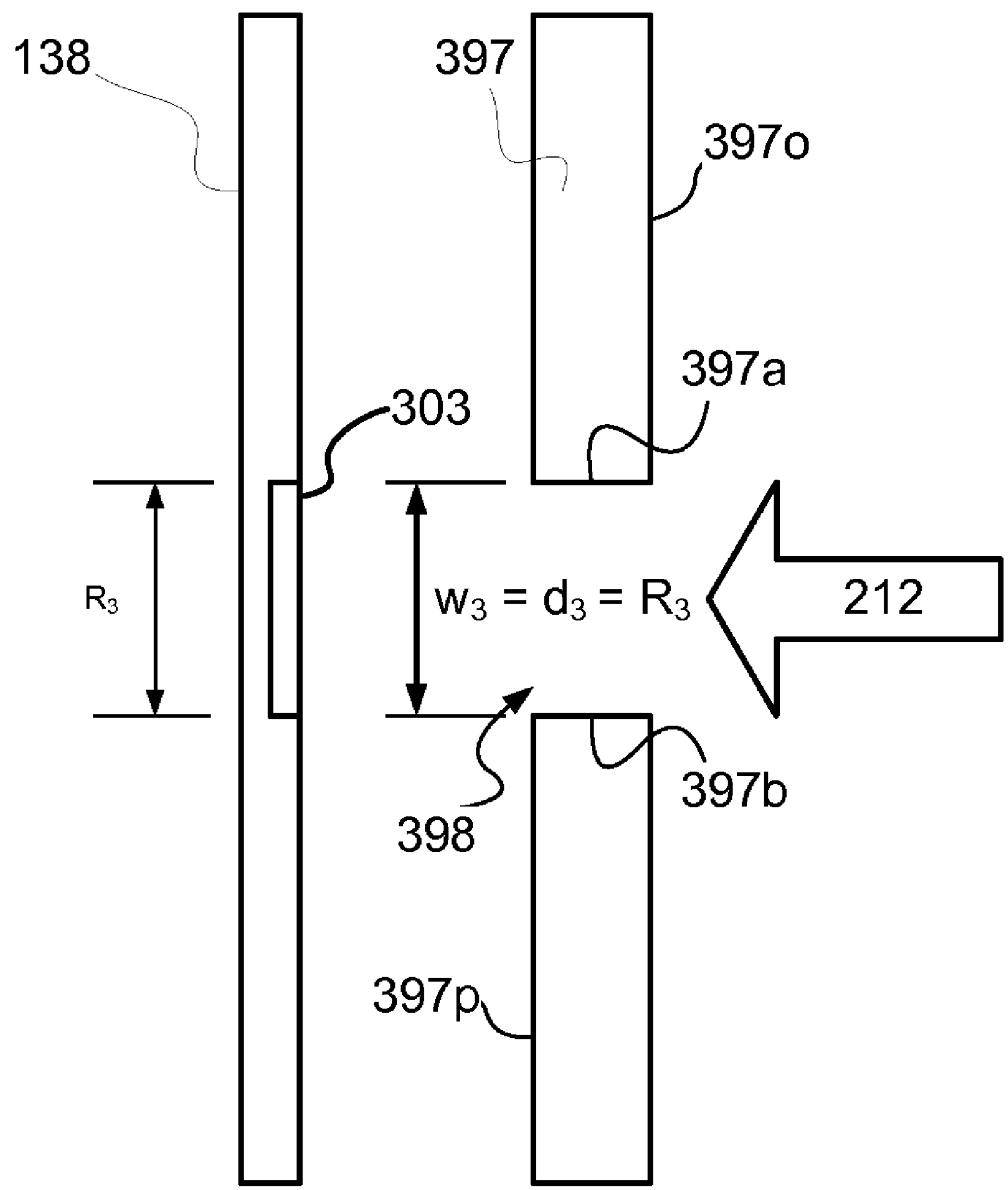
FIG. 3 illustrates the technique for manufacturing solar cells according to one embodiment of the present disclosure.

Referring to FIG. 3, there is shown a technique for manufacturing solar cells according to one embodiment of the present disclosure. In the present embodiment, the substrate 138 may be positioned downstream of the ion source 280. The mask 397 may also be positioned downstream of the ion source 280, near the substrate 138. In the present embodiment, the mask 397 may be substantially parallel to the substrate 138. Although, the figure shows the mask 397 being spaced apart from the substrate 138, the present disclosure does not preclude an embodiment in which at least a portion of the mask 397 is in contact with at least a portion of the substrate 138.

The mask 397 in the present embodiment may be similar to those shown in FIG. 2$a$-2$c$. Similar to those shown in FIG. 2$a$-2$c$, the mask 397 may comprise one or more apertures 398. The number, shape, size, and location of one or more apertures 398 are not limited to a particular number, shape, size, and location. The mask 397 may also comprise a front surface 397$o$; a back surface 397$p$; first and second aperture side walls 397$a$ and 397$b$ extending from the front surfaces 397$o$ to the back surface 397$p$ and defining the aperture 398. As illustrated in FIG. 3, the front surface 397$o$ is exposed to the ion beam 212, whereas the back surface 397$p$ is proximate to the substrate 138. Meanwhile, the first and second side walls 397$a$ and 397$b$, which face each another, may be substantially parallel with one another and may be spaced apart by an aperture side wall distance $d_3$. The aperture 398 defined by the aperture side walls 397$a$ and 397$b$ may be substantially perpendicular to the front surface 397$o$, the back surface 397$p$, and the substrate 138.

Upstream of the substrate 138 and the mask 397, in the ion source 280, the ions 212 may be generated. The generated ions 212 may be directed toward the substrate 138 in a form of a ribbon ion beam 212, as illustrated in FIG. 1, or a spot ion beam. The ions 212 may preferably be directed at an angle substantially parallel to the aperture 398. For example, the ions 212 may preferably be directed toward the substrate 138 at substantially 0°, substantially perpendicular to the substrate 138. A portion of the ions 212 may as through the aperture 398 and implanted into the substrate 138 to form an implanted region 303. As illustrated in the figure, the implanted region 303 may have an implanted width $R_3$.

In the present embodiment, the implanted width $R_3$ may be substantially equal to the aperture side wall distance $d_3$. This may be due to the fact that the path of the ions 212 is substantially parallel to the aperture 398. As the ions 212 travel in substantially parallel path, there may be little or no additional shadowing effect that may be caused by the aperture side walls 397$a$ and 397$b$. With little or no additional shadowing effect, the aperture width $w_3$ of the aperture 398 may substantially corresponds to the aperture side wall distance $d_3$. The ions 212 passing through the aperture 398 may form the implanted region 303 with the width $R_3$ substantially corresponding to the aperture side wall distance $d_3$. If the substrate 138 is a solar cell, a solar cell with a pattern corresponding to the aperture side wall distance $d_3$ of the mask 398 may be formed.

Figure 4:
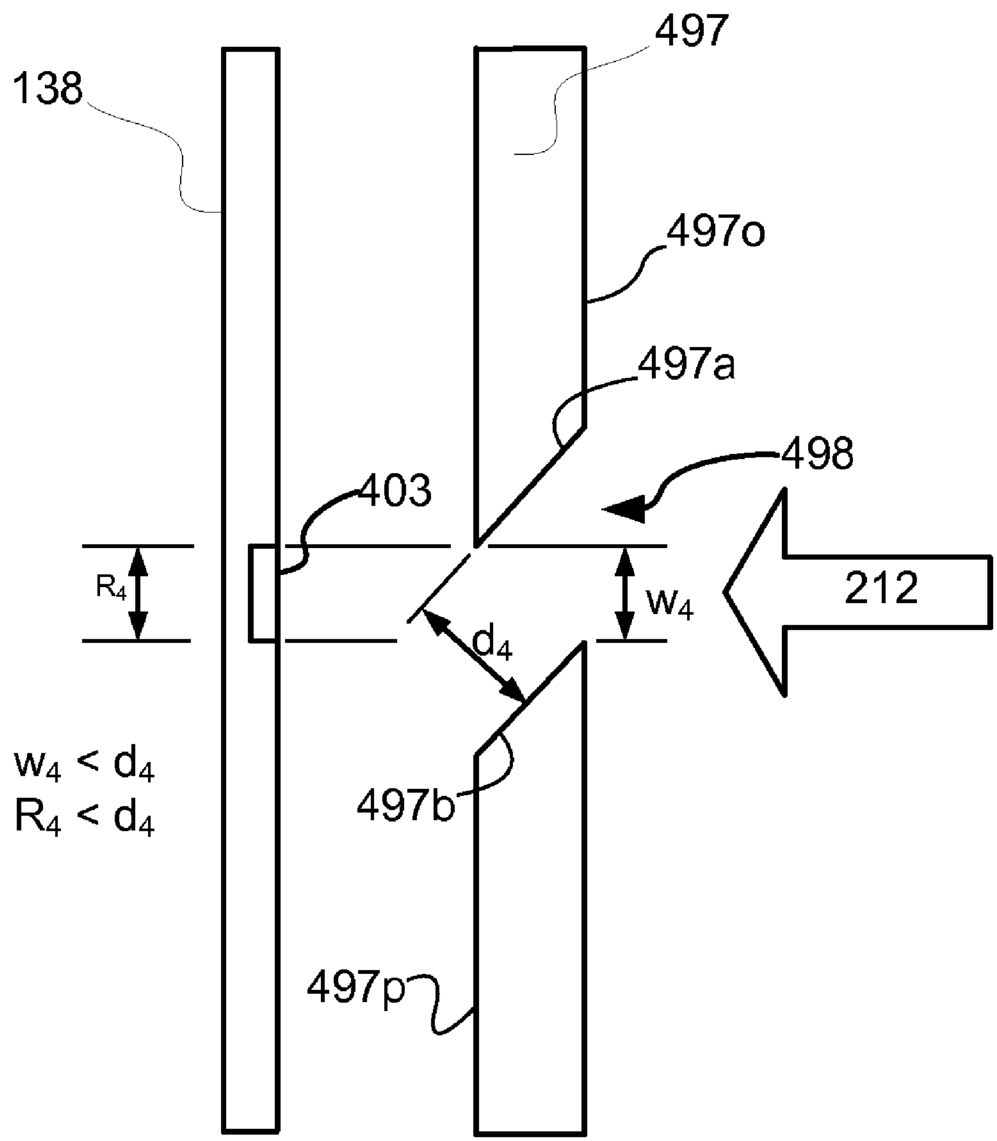
FIG. 4 illustrates the technique for manufacturing solar cells according another embodiment of the present disclosure.

Referring to FIG. 4, there is shown a technique for manufacturing solar cells according to another embodiment of the present disclosure. The present technique may contain many features similar to the technique disclosed earlier with FIG. 3. For purpose of clarity and simplicity, detail description of similar features may be omitted.

In the present embodiment, a mask 497 is disposed proximate to the substrate 138, and ions are implanted into the substrate 138 via one or more apertures 498 of the mask 497. In the present embodiment, the mask 497 may be substantially parallel to the substrate 138. Although, the figure shows the mask 497 being spaced apart from the substrate 138, the present disclosure does not preclude an embodiment in which at least a portion of the mask 497 is in contact with at least a portion of the substrate 138.

The mask 497 in the present embodiment may be similar to those shown in FIGS. 2$a$, 2$b$, and 2$d$. Similar to those shown in FIGS. 2$a$, 2$b$, and 2$d$, the mask 497 may comprise one or more apertures 498. The number, shape, size, and location of one or more apertures 498 are not limited to a particular number, shape, size, and location. The mask 497 may also comprise a front surface 497$o$; a back surface 497$p$; first and second aperture side walls 497$a$ and 497$b$ extending from the front surfaces 497$o$ to the back surface 497$p$ and defining the aperture 498. Meanwhile, the first and second side walls 497$a$ and 497$b$, which face each another, may be substantially parallel with one another and may be spaced apart by an aperture side wall distance $d_4$. In the present embodiment, two aperture side walls 497$a$ and 497$b$ may be non-perpendicular (e.g. oblique) to the front surface 497$o$, the back surface 497$p$, and/or the substrate 138. The aperture 498 defined by the side walls 497$a$ and 497$b$ may also be non-perpendicular to the front surface 497$o$, the back surface 497$p$, and/or the substrate 138.

After the mask 497 is disposed near the substrate 138, ions 212 are directed toward the mask 497 and the substrate 138. In the present embodiment, the ions 212 may preferably be directed toward the substrate at any angle that is non-parallel to the aperture 498. For example, the ions 212 may be directed toward the substrate 138 at substantially 0°. A portion of the ions 212 may pass through the aperture 498 and implanted into the substrate 138 to form an implanted region 403. As illustrated in the figure, the implanted region 403 may have an implanted width $R_4$.

In the present embodiment, the implanted width $R_4$ may be smaller than the aperture side wall distance $d_4$. This may be due to the fact that the path of the ions 212 is approximately non-parallel to the aperture 498. As the ions 212 travel in approximately non-parallel path, there may be additional shadowing effect caused by at least one of the aperture side walls 497*a* and 497*b*. As such, additional ions 212 may be blocked by the aperture side walls 497*a* and 497*b*. With the additional shadowing effect, the aperture width $w_4$ of the aperture 498 may be smaller than the aperture side wall distance $d_4$. The ions 212 passing through the aperture 498 may form the implanted region 403 with the width $R_4$ smaller than the aperture side wall distance $d_4$. By implanting the ions 212 through the mask 497 with the aperture 498 having a non-parallel relationship with the ion beam path, a pattern smaller than the aperture side wall distance $d_4$ of the mask 498 may be formed. If the substrate 138 is a solar cell, a solar cell with small feature size may be formed without decreasing the aperture side wall distance $d_4$. Accordingly, a mask with very narrow or small aperture size may not be necessary.

Figure 5:
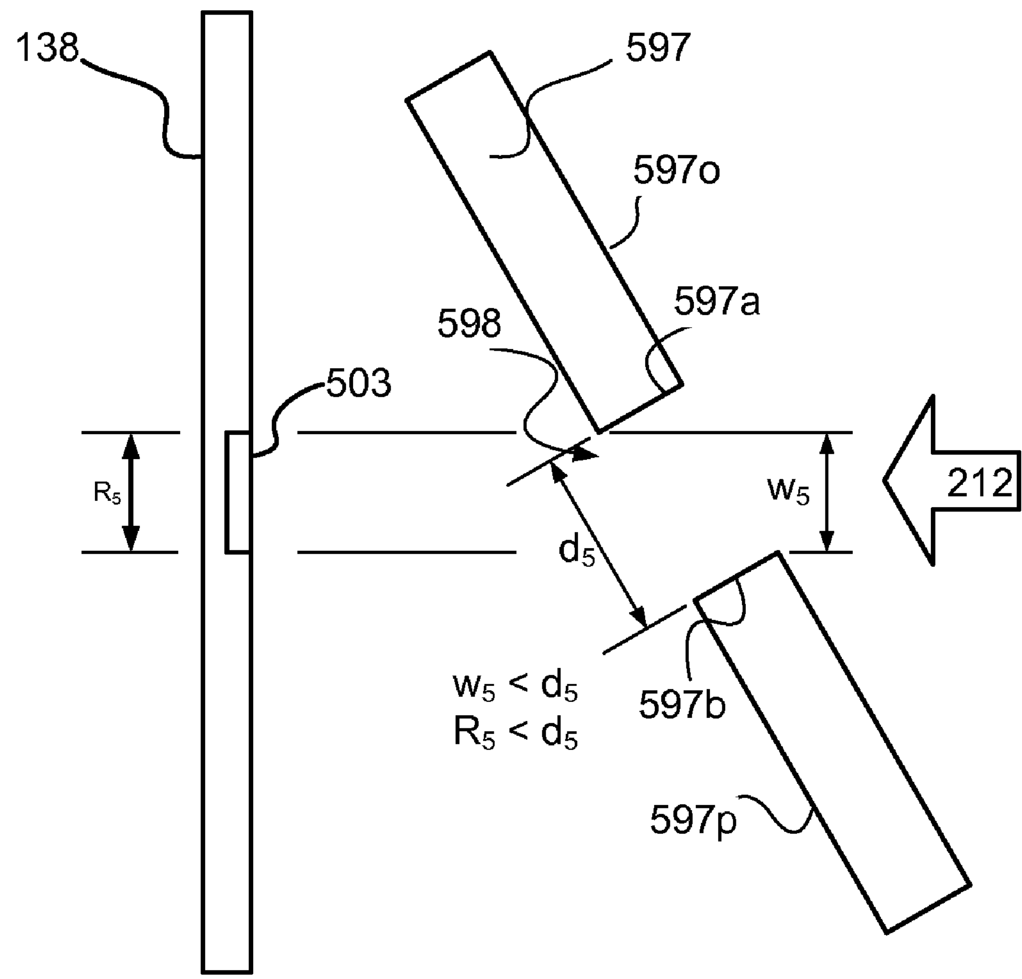
FIG. 5 illustrates the technique for manufacturing solar cells according another embodiment of the present disclosure.

Referring to FIG. 5, there is shown a technique for manufacturing solar cells according to another embodiment of the present disclosure. The present technique may contain many features similar to the technique disclosed earlier with FIGS. 3 and 4. For purpose of clarity and simplicity, detail description of similar features may be omitted.

In the present embodiment, a mask 597 is disposed proximate to the substrate 138, and ions 212 are implanted into the substrate 138 via one or more apertures 598 of the mask 597. Although the figure illustrates the mask 597 and the substrate 138 being spaced apart, the present disclosure does not preclude an embodiment where at least a portion of the mask 597 is in contact with at least a portion of the substrate 138.

The mask 597 in the present embodiment may be similar to the mask illustrated in FIGS. 2*a*-2*c* and 3. Similar to those shown in FIGS. 2*a*-2*c* and 3, the mask 597 may comprise one or more apertures 598. The number, shape, size, and location of one or more apertures 598 are not limited to a particular number, shape, size, and location. The mask 597 may also comprise a front surface 597*o*; a back surface 597*p*; first and second aperture side walls 597*a* and 597*b* extending from the front surfaces 597*o* to the back surface 597*p* and defining the aperture 598. As illustrated in FIG. 5, the front surface 597*o* is exposed to the ion beam 212, whereas the back surface 597*p* is proximate to the substrate 138. Meanwhile, the first and second side walls 597*a* and 597*b*, which face each another, may be substantially parallel with one another and may be spaced apart by an aperture side wall distance $d_5$. The aperture 598 defined by the aperture side walls 597*a* and 597*b* may be substantially perpendicular to the front surface 597*o* and the back surface 597*p*.

In the present embodiment, the mask 597 is tilted or rotated, and maintained at approximately non-parallel orientation relative to the substrate 138. As such, the aperture 598 may extend obliquely relative to the substrate 138, in a non-perpendicular orientation. The mask 597 may be supported in the tilted or rotated position by the platen 295, the substrate scanner, and/or the mask holder 199.

The ions 212, in the present embodiment, may preferably be directed toward the substrate 138 at one or more angles that are non-parallel to the aperture 598 of the mask 597. For example, the ions 212 may be directed toward the substrate at 0° (i.e. perpendicular to the substrate). As such, the path of the ions 212 may be in a non-parallel relationship with the aperture 598. A portion of the ions 212 may pass through the aperture 598 and implanted into the substrate 138 to form an implanted region 503. As illustrated in the figure, the implanted region 503 may have an implanted width $R_5$.

As illustrated in FIG. 5, the implanted region 503 with the implanted width $R_5$ may be smaller than the aperture side wall distance $d_5$. This may be due to the fact that the path of the ions 212 is approximately non-parallel to the aperture 598. As the ions 212 travel in approximately non-parallel path, there may be additional shadowing effect caused by at least one of the aperture side walls 597*a* and 597*b*, and additional ions 212 may be blocked. With the additional shadowing effect, the aperture width $w_5$ of the aperture 598 may be smaller than the aperture side wall distance $d_5$. The ions 212 passing through the aperture 598 may form the implanted region 503 with the width $R_5$ smaller than the aperture side wall distance $d_5$. If the substrate 138 is a solar cell, a solar cell with very fine or narrow feature size may be formed without decreasing the aperture side wall distance $d_5$ of the mask 597. As such, a mask with very narrow or small aperture size may not be necessary.

Figure 6:
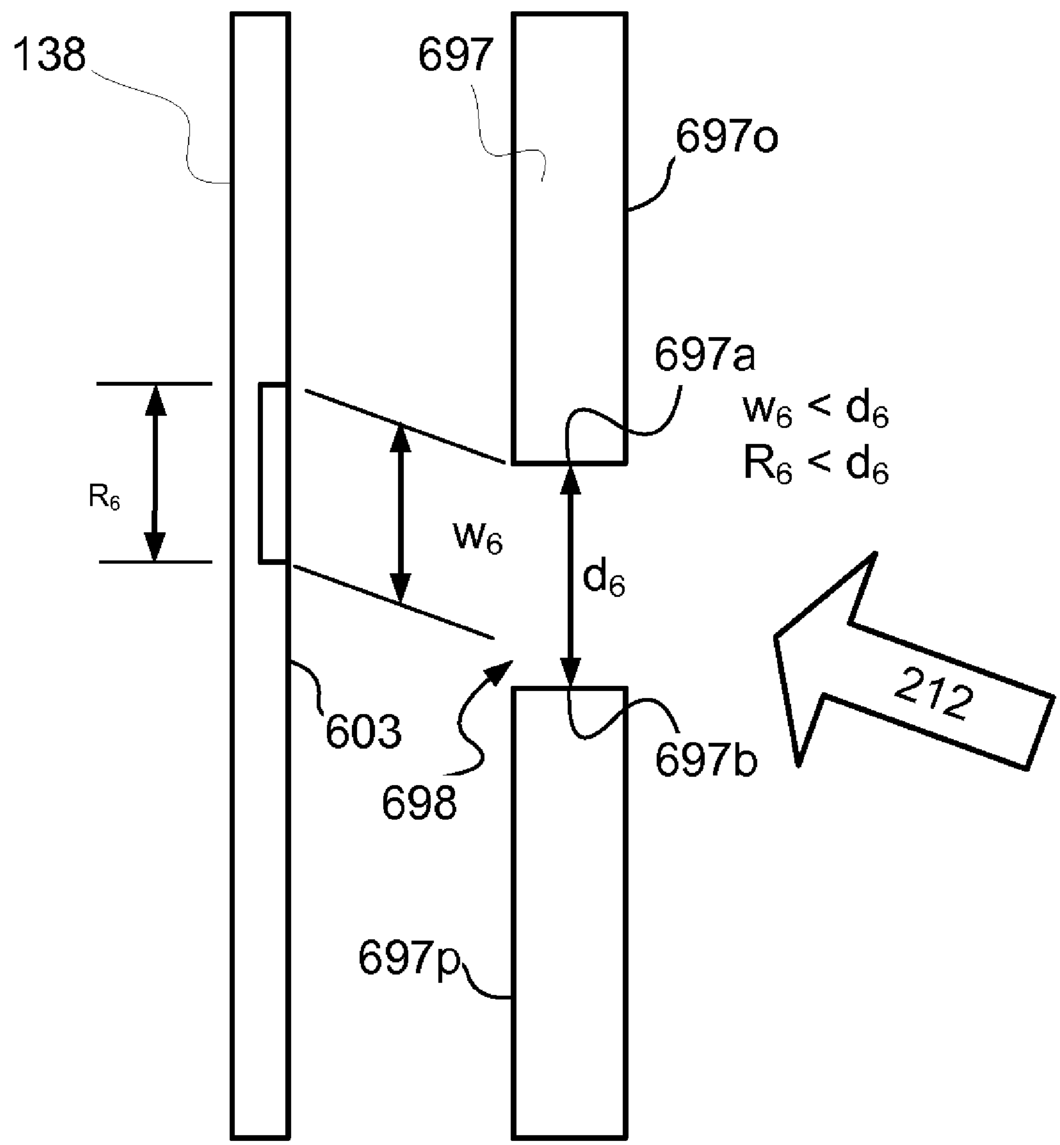
FIG. 6 illustrates the technique for manufacturing solar cells according another embodiment of the present disclosure.

Referring to FIG. 6, there is shown a technique for manufacturing solar cells according to another embodiment of the present disclosure. The present technique may contain many features similar to the technique disclosed earlier with FIG. 3-5. For purpose of clarity and simplicity, detail description of similar features may be omitted.

In the present embodiment, the mask 697 is disposed proximate to the substrate 138, and ions 212 are implanted into the substrate 138 via one or more apertures 698 of the mask 597. In the present embodiment, the mask 697 may be substantially parallel to the substrate 138. Although the figure illustrates the mask 697 and the substrate 138 being spaced apart, the present disclosure does not preclude an embodiment where at least a portion of the mask 697 is in contact with at least a portion of the substrate 138.

The mask 697 in the present embodiment may be similar to the mask illustrated in FIGS. 2*a*-2*c*, 3, and 5. Similar to those shown in FIGS. 2*a*-2*c*, 3, and 5, the mask 697 may comprise one or more apertures 698. The number, shape, size, and location of one or more apertures 698 are not limited to a particular number, shape, size, and location. The mask 697 may also comprise a front surface 697*o*; a back surface 697*p*; first and second aperture side walls 697*a* and 597*b* extending from the front surfaces 697*o* to the back surface 697*p* and defining the aperture 698. As illustrated in FIG. 6, the front surface 697*o* is exposed to the ion beam 212, whereas the back surface 697*p* is proximate to the substrate 138. Meanwhile, the first and second side walls 697*a* and 697*b*, which face each another, may be substantially parallel with one another and may be spaced apart by an aperture side wall distance $d_6$. The aperture 698 defined by the aperture side walls 697*a* and 697*b* may be substantially perpendicular to the front surface 697*o*, the back surface 597*p*, and the substrate 138.

In the present embodiment, the ions 212 may preferably be directed toward the substrate 138 at one or more angles that are non-parallel to the aperture 698 of the mask 697. For example, the ions 212 may be directed toward the substrate at an angle other than 0° (i.e. non-perpendicular to the substrate). As such, the path of the ions 212 may be in a non-parallel relationship with the aperture 698. A portion of the ions 212 may pass through the aperture 698 and implanted into the substrate 138 to form an implanted region 603. As illustrated in the figure, the implanted region 603 may have an implanted width $R_6$.

As illustrated in FIG. 6, the implanted region 603 with the implanted width $R_6$ may be smaller than the aperture side wall distance $d_6$. This may be due to the fact that the path of the ions 212 is approximately non-parallel to the aperture 698. As the ions 212 travel in approximately non-parallel path, there may be additional shadowing effect caused by at least one of the aperture side walls 697*a* and 697*b*, and additional ions 212 may be blocked. With the shadowing effect, the aperture width $w_6$ of the aperture 698 may be smaller than the aperture side wall distance $d_6$. The ions 212 passing through the aperture 698 may form the implanted region 603 with the width $R_6$ smaller than the aperture side wall distance $d_5$. If the substrate 138 is a solar cell, a solar cell with very fine or narrow feature size may be formed without decreasing the aperture side wall distance $d_5$ of the mask 697. Accordingly, a mask with very narrow or small aperture size may not be necessary.

In the present disclosure, novel techniques for manufacturing a substrate, for example a solar cell, are disclosed. The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. An ion implanter for processing a solar cell, the ion implanter comprising:

an ion source for generating ions;

a target support disposed downstream of the ion source for supporting the solar cell in a target plane;

a mask disposed between the ion source and the target support, the mask including a front surface, a back surface, at least one aperture extending from the front surface to the back surface and along an aperture direction, and a side surface extending from the front surface to the back surface to define the at least one aperture, wherein at least a portion of the side surface is non-perpendicular to at least one of the front and back surfaces; and a beam-line component for directing ions to the solar cell along an ion beam path, wherein the ion beam path is non-parallel relative to the aperture direction.

2. The ion implanter according to claim 1, wherein the aperture direction is non-perpendicular relative to the solar cell.

3. The ion implanter according to claim 1, wherein the mask is in a substantially parallel orientation with respect to the solar cell.

4. The ion implanter of claim 1, wherein the at least one aperture extends in a direction that is non-perpendicular to at least one of the front and back surface of the mask.

5. The ion implanter of claim 1, wherein the dons contains one or more elements selected from a group consisting of: hydrogen (H), boron (B), aluminum (Al), gallium (Ga), indium (In), thallium (Tl), carbon (C), silicon (Si), germanium (Ge), tin (Sn), lead (Pb), nitrogen (N), phosphorous (P), arsenic (As), antimony (Sb), bismuth (Bi) oxygen, tellurium (Te), fluorine (F), chlorine (Cl), helium (He), neon (Ne), krypton (Kr), argon (Ar), and xenon (Xe).

6. The ion implanter of claim 1, wherein the mask comprises one or more materials selected from a group consisting of: graphite, silicon, quartz, and SiC.

7. The ion implanter of claim 1, wherein the aperture has one or more shapes selected from a group consisting of: a circular shape, a rectangular shape, an oval shape, and a square shape.

8. The ion implanter of claim 1, further comprising:

a mask holder configured to support the mask in a mask plane, the mask plane being non-parallel to the target plane.

9. An ion implanter for processing a solar cell, the ion implanter comprising:

an ion source for generating ions;

a target support disposed downstream of the ion source to support the solar cell; and a mask disposed between the ion source and the target support, the mask including a front surface, a back surface, and a side surface extending from the front surface to the back surface to define at least one aperture, wherein at least a portion of the side surface is non-perpendicular to at least one of the front and back surfaces.

10. The ion implanter according to claim 9, wherein the mask is in a substantially parallel to the solar cell.

11. The ion implanter of claim 9, wherein the ions contains one or more elements selected from a group consisting of: hydrogen (H), boron (B), aluminum (Al), gallium (Ga), indium (In), thallium (Ti), carbon (C), silicon (Si), germanium (Ge), tin (Sn), lead (Pb), nitrogen (N), phosphorous (P), arsenic (As), antimony (Sb), bismuth (Bi) oxygen, tellurium (Te), fluorine (F), chlorine (Cl), helium (He), neon (Ne), krypton (Kr), argon (Ar), and xenon (Xe).

12. The ion implanter of claim 9, wherein the mask comprises one or more materials selected from a group consisting of: graphite, silicon, quartz, and SiC.

13. The ion implanter of claim 9, wherein the at least one aperture has at least one of a circular shape, a rectangular shape, an oval shape, and a square shape.

14. The ion implanter of claim 9, wherein an aperture side wall distance near the top surface of the mask is larger than the aperture side wall distance near the bottom surface of the mask.

15. The ion implanter of claim 9, wherein an aperture side wall distance near the top surface of the mask is smaller than the aperture side wall distance near the bottom surface of the mask.

16. The ion implanter of claim 9, wherein an aperture side wall distance near the top surface of the mask is substantially equal to the aperture side wall distance near the bottom surface of the mask.

17. An ion implanter for processing a solar cell, the ion implanter comprising:

an ion source for generating ions;

a target support disposed downstream of the ion source to support the solar cell; and a mask being disposed between the ion source and the target support and substantially parallel to the substrate, the mask including a front surface, a back surface, and a side surface extending from the front surface to the back surface to define at least one aperture, at least a portion of the side surface being non-perpendicular to at least one of the front and back surfaces, the mask.

18. The ion implanter of claim 17, wherein the mask comprises one or more materials selected from a group consisting of: graphite, silicon, quartz, and SiC.

* * * * *